United States Patent
Atri et al.

(10) Patent No.: US 8,032,787 B2
(45) Date of Patent: Oct. 4, 2011

(54) VOLATILE STORAGE BASED POWER LOSS RECOVERY MECHANISM

(75) Inventors: Sunil R Atri, Folsom, CA (US); Sean S Eilert, Penryn, CA (US)

(73) Assignee: Intel Corporation, Santa Clara, CA (US)

( * ) Notice: Subject to any disclaimer, the term of this patent is extended or adjusted under 35 U.S.C. 154(b) by 2053 days.

(21) Appl. No.: 10/933,862

(22) Filed: Sep. 2, 2004

(65) Prior Publication Data

US 2006/0059385 A1   Mar. 16, 2006

(51) Int. Cl.
*G06F 11/00* (2006.01)

(52) U.S. Cl. .......................................................... 714/22

(58) Field of Classification Search ...................... 714/22
See application file for complete search history.

(56) References Cited

U.S. PATENT DOCUMENTS

| | | | |
|---|---|---|---|
| 5,522,034 A * | 5/1996 | Watari et al. ..................... 714/22 |
| 5,542,042 A * | 7/1996 | Manson ............................ 714/2 |
| 5,732,138 A | 3/1998 | Noll et al. |
| 6,170,066 B1 | 1/2001 | See |
| 6,295,577 B1 | 9/2001 | Anderson et al. |
| 6,934,879 B2 * | 8/2005 | Misra et al. ....................... 714/6 |
| 6,988,222 B2 * | 1/2006 | Sparer ............................. 714/22 |
| 7,000,146 B2 * | 2/2006 | Mackey et al. ................... 714/22 |
| 7,093,167 B2 * | 8/2006 | Komiya ........................... 714/44 |
| 7,139,937 B1 * | 11/2006 | Kilbourne et al. .............. 714/47 |
| 7,213,120 B2 * | 5/2007 | Hotaka ........................... 711/163 |
| 2002/0085714 A1 * | 7/2002 | Inoha et al. ................... 380/201 |
| 2005/0071731 A1 | 3/2005 | Atri et al. |
| 2005/0160316 A1 * | 7/2005 | Shipton ........................... 714/22 |
| 2009/0132815 A1 * | 5/2009 | Ginter et al. ................... 713/164 |

FOREIGN PATENT DOCUMENTS

| | | |
|---|---|---|
| EP | 0953984 | 11/1999 |
| JP | 06-051858 | 2/1994 |
| JP | 2003-122648 | 4/2003 |

OTHER PUBLICATIONS

PCT/US2005/028916 International Search Report and Written Opinion mailed Feb. 8, 2006.
Australian Patent Office, Written Opinion issued in corresponding Singapore Application No. 0701438-4, 6 pages, Oct. 28, 2008.
Japanese Patent Office, Summary of "Notice of Reasons for Rejection" issued in corresponding Japanese Application No. 2007-529932, 4 pages, Jun. 8, 2010.

* cited by examiner

*Primary Examiner* — Michael Maskulinski
(74) *Attorney, Agent, or Firm* — Trop, Pruner & Hu, P.C.

(57) ABSTRACT

According to some embodiments, power loss recovery information related to an active operation is stored in volatile memory. Upon detection of a power loss condition, the power loss recovery information is copied to non-volatile memory. Upon a return of power, the power loss recovery information is used to complete or correct the interrupted operation.

22 Claims, 2 Drawing Sheets

VOLATILE STORAGE BASED POWER LOSS RECOVERY MECHANISM

BACKGROUND

Description of the Related Art

Non-volatile storage has the ability to retain data despite a loss of power. Due to its non-volatile nature, flash memory is an enabling technology for many portable and wireless devices, for example, cell phones, lap top computers, and personal data assistants.

An operation to non-volatile storage, for example a data write operation, may take many cycles to complete. In addition to writing data, formatting information is often updated during the operation. For example, a flash media is a system with various configurations of flash memory devices that may include hardware with additional decoding logic to manage and coordinate the various arrays of flash memory devices. Typically, a flash memory block of a flash media is divided into individual data units or sectors, with each sector having an associated header or identifying a sectors status. A sudden loss of power may occur during an active operation, for example, if a cell phone is dropped and the battery is disconnected, causing data or formatting information to be lost. Loss of formatting information can be catastrophic to flash media and result in the inability to access any data stored in the particular sector of the flash media.

Current power loss recovery mechanisms include bit twiddling, where status bits are used to track file system operations. For example, one bit may be set to indicate the start of a write operation and another may be set upon completion of a write operation. Thus, a full write operation occurs to write one bit (or cell). Upon power recovery, software scans these bits to determine if a write operation was interrupted so that any errors can be dealt with and/or corrected. The bit operations are expensive in terms of performance and in code complexity. A more efficient power loss recovery solution is sought.

BRIEF DESCRIPTION OF THE DRAWINGS

The present invention may be better understood, and its numerous features and advantages made apparent to those skilled in the art by referencing the accompanying drawings.

The use of the same reference symbols in different drawings indicates similar or identical items.

DESCRIPTION OF THE EMBODIMENT(S)

In the following description, numerous specific details are set forth. However, it is understood that embodiments of the invention may be practiced without these specific details. In other instances, well-known methods, structures and techniques have not been shown in detail in order not to obscure an understanding of this description.

References to "one embodiment," "an embodiment," "example embodiment," "various embodiments," etc., indicate that the embodiment(s) of the invention so described may include a particular feature, structure, or characteristic, but not every embodiment necessarily includes the particular feature, structure, or characteristic. Further, repeated use of the phrase "in one embodiment" does not necessarily refer to the same embodiment, although it may.

As used herein, unless otherwise specified the use of the ordinal adjectives "first," "second," "third," etc., to describe a common object, merely indicate that different instances of like objects are being referred to, and are not intended to imply that the objects so described must be in a given sequence, either temporally, spatially, in ranking, or in any other manner.

Unless specifically stated otherwise, as apparent from the following discussions, it is appreciated that throughout the specification discussions utilizing terms such as "processing," "computing," "calculating," or the like, refer to the action and/or processes of a computer or computing system, or similar electronic computing device, that manipulate and/or transform data represented as physical, such as electronic, quantities into other data similarly represented as physical quantities.

In a similar manner, the term "processor" may refer to any device or portion of a device that processes electronic data from registers and/or memory to transform that electronic data into other electronic data that may be stored in registers and/or memory. A "computing platform" may comprise one or more processors.

Figure 1:
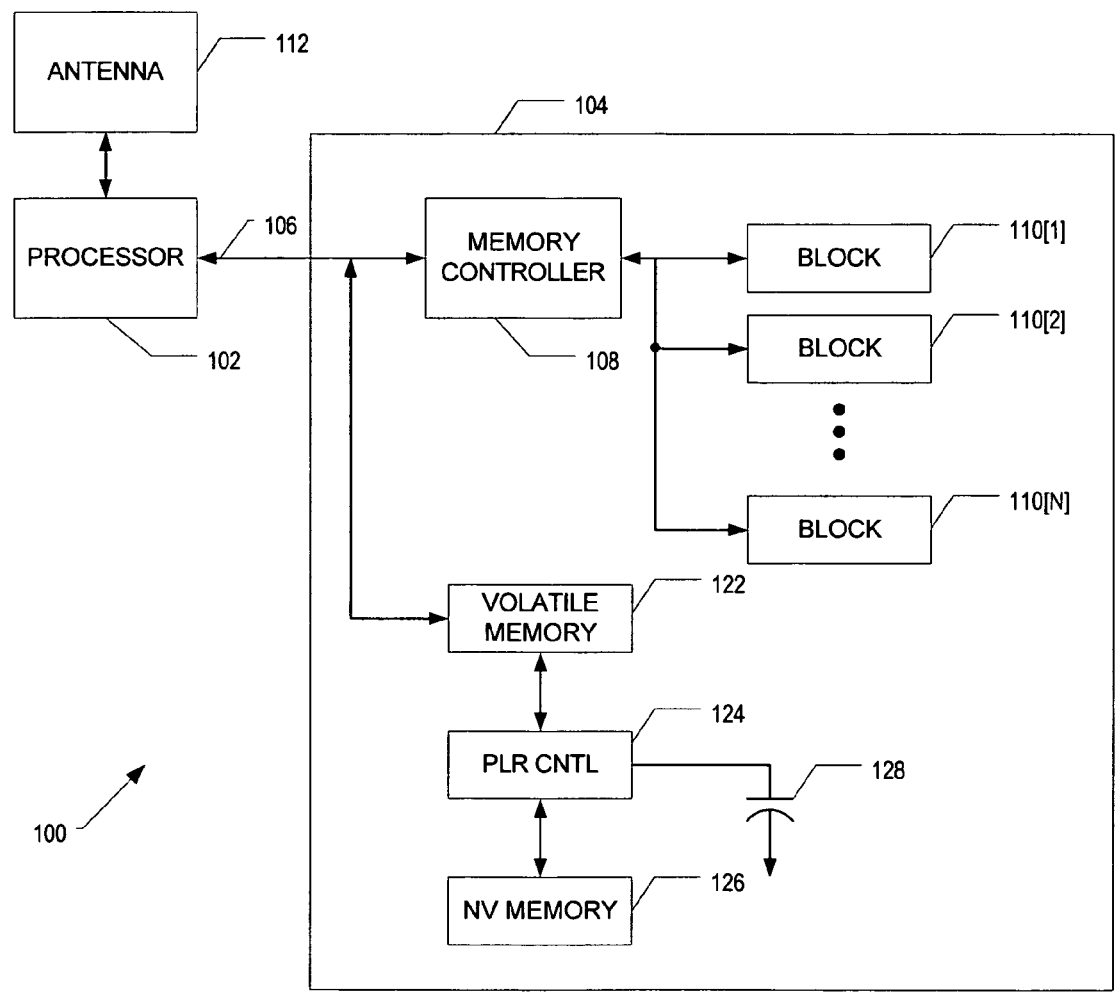
FIG. 1 illustrates a portion of a computing system according to an embodiment of the present invention.

FIG. 1 illustrates a portion of a computing system 100 according to an embodiment of the present invention. Processor 102 may issue commands and data to memory system 104 over bus 106. Memory system 104 includes a memory controller 108 and one or more blocks 110(1)-(N) of non-volatile memory. Memory controller 108 may receive the commands, store the address indicators, configure the control signals, and perform an operation on selected ones of blocks 110(1)-(N).

Memory system 104 further includes volatile memory 122, power loss recovery controller 124, non-volatile memory 126, and charge storage 128. Volatile memory 122 may include flip-flops, random access memory (RAM) or other volatile storage that is not persistent during power loss. Blocks 110 and non-volatile memory 126 may include, for example, FLASH memory, EEPROM, EPROM, ferromagnetic digital memory, phase-change memory, Chalcogenide memory, polymer memory, and/or the like.

During an active write operation or other such operation, power loss recovery (PLR) information is stored in volatile memory 122. Upon detection of a power loss condition, power loss recovery controller 124 utilizes power stored in charge storage 128 to write the PLR information from volatile memory 122 to non-volatile memory 126. Upon return of power, power loss recovery controller 124 copies the PLR information back to volatile memory 122 from non-volatile memory 126. PLR information is used by software operating on processor 102 to track progress of active operations to selected ones of blocks 110 such that if power is lost during an active operation the operation can be completed or backed out of upon restoration of power. For example, PLR information may include one or more bits that are set to indicate an active write operation and that are cleared to indicate completion of the active write operation. Additionally or alternatively, PLR information may include address information related to the active write operation.

Charge storage 128 may include one or more capacitors. The number of bits of PLR information available is limited by the charge stored for copying these bits to non-volatile memory after loss of power. Charge storage 128 may also provide power to volatile memory 122 until the power loss recovery information has been stored in non-volatile memory 126. Additionally, upon return of power, software operating on processor 102 may check the power loss recovery information stored in volatile memory 122 and take appropriate action to complete or correct the interrupted operation. Multiple power losses are handled by not clearing non-volatile memory 126 until after the interrupted operation is complete. Charge storage 128 may be integrated into a single piece of silicon composing memory system 104, may be inside the packaging of memory system 104 or may be an external component provided by, for example, an original equipment manufacturer (OEM).

Volatile memory 122 can provide fast write capability, unlimited cycling, and low energy writes. In one embodiment of the present invention, PLR information may include any type of information that is rewritten often that must be maintained upon power loss. For example, PLR information stored may include a current random number in a security application where random numbers are continuously generated and the previous number is used as a seed to generate the next random number. Other types of information may include call timer information, session keys with a host server, most recent radio settings, power loss recovery bits for data stored in another device in the system, the present value of a monotonic counter and the like.

In one embodiment of the present invention, PLR information may include a status bit that indicates whether the PLR information is in-use or idle. In the event that power is lost and the PLR information is in-use, the contents of the PLR information including the status bit is copied to non-volatile memory 126 where it is stored until power is restored. On power-up, if the status bit indicates the PLR information is in-use, the PLR information is copied to volatile memory 122 where software can utilize the PLR information to recover from the power loss event.

Although illustrated as separate components, it should be understood that volatile memory 122 may be part of power loss recovery controller 124. Further, power loss recovery controller 124 may be part of memory controller 108. Further, non-volatile memory 126 may be part of memory blocks 110. The invention is not limited in this context.

It should be understood that, in addition to a write operation, there are various other commands that may be issued by processor 102 to memory system 104 over bus 106, such as Block Erase, Read Data, Read Status, and the like. The detection of power loss may be performed during these other commands as well as or instead of during write operations. The invention is not limited in this context.

Computing system 100 is intended to represent any number of computing and communication systems, including, but not limited to, mainframes, minicomputers, servers, workstations, personal computers, notepads, personal digital assistants, cell phones, various wireless communication devices that may include one or more antenna(e) 112 and embedded systems, just to name a few.

Figure 2:
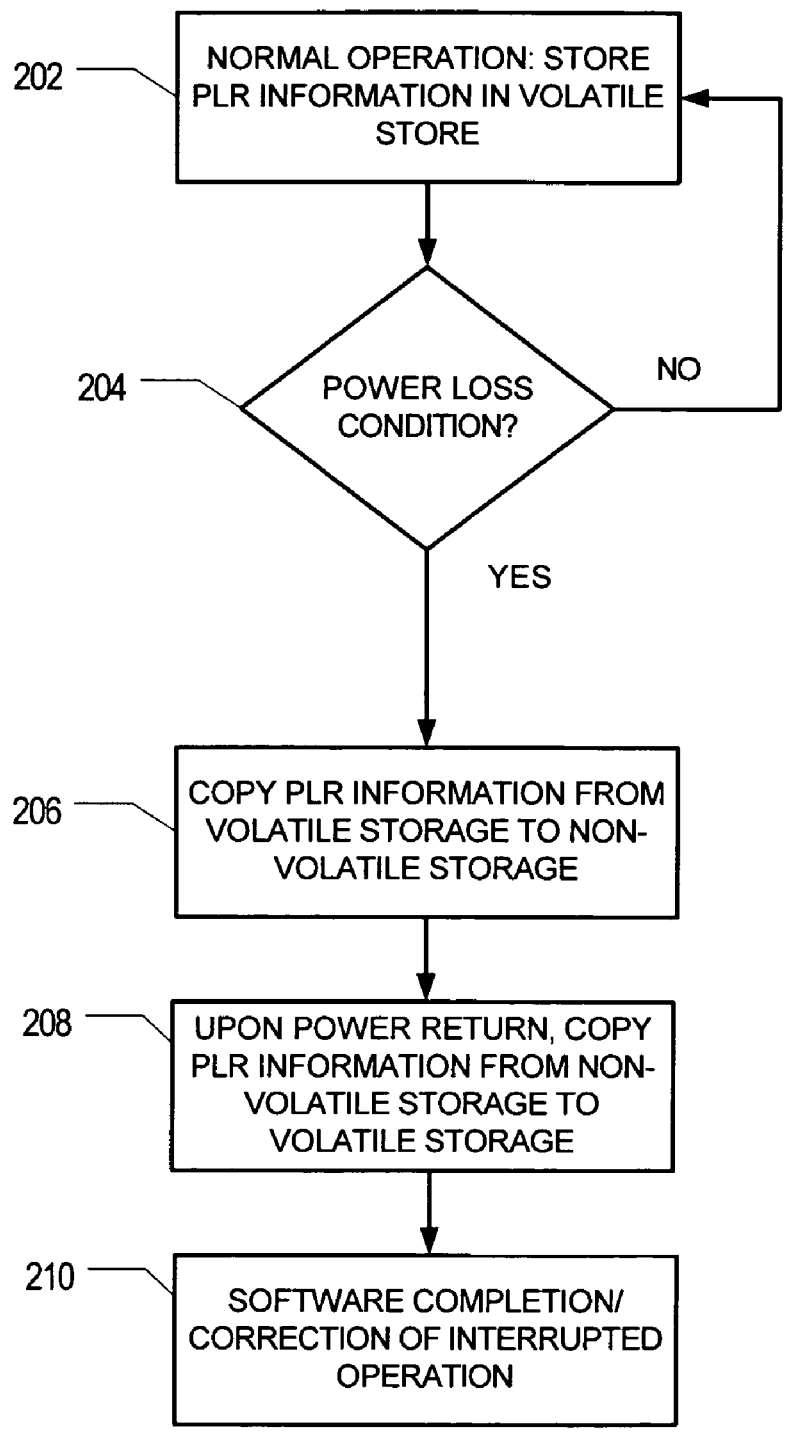
FIG. 2 illustrates a power loss recovery flow diagram according to an embodiment of the present invention.

FIG. 2 illustrates a power loss recovery flow diagram according to an embodiment of the present invention. During normal system operation, power loss recovery information related to a current operation, for example, a write operation, is stored in volatile storage, block 202. A power loss condition is monitored for, block 204. If a power loss condition is not detected, normal operation continues, block 202. Upon the detection of a power loss condition, the power loss recovery information is copied from volatile storage to non-volatile storage using a stored energy source, block 206. Upon return of power, the power loss recovery information is copied from non-volatile storage to volatile storage, block 208. Software determines if an active operation was interrupted and if so, takes actions to complete or correct the operation, block 210.

In an alternate embodiment of the present invention, upon power loss, the power loss recovery information stored in volatile storage is first checked to determine if an active operation was interrupted. If so, the power loss recovery information is copied to non-volatile storage. If not, no action occurs. The invention is not limited in this context.

In another alternate embodiment of the present invention, upon power recovery, a determination is made if an active operation was interrupted. If so, the power loss recovery information is copied to volatile storage. If not, no action occurs. The invention is not limited in this context.

In another alternate embodiment of the present invention, upon power recovery, software reads PLR information directly from the non-volatile memory, eliminating the need to copy the information back to the volatile memory. Software may clear the non-volatile memory after taking action to complete or correct the operation. The invention is not limited in this context.

The operations referred to herein may be modules or portions of modules (e.g., software, firmware, or hardware modules). For example, the software modules discussed herein may include script, batch or other executable files, or combinations and/or portions of such files. The software modules may include a computer program or subroutines thereof encoded on computer-readable media.

Additionally, those skilled in the art will recognize that the boundaries between modules are merely illustrative and alternative embodiments may merge modules or impose an alternative decomposition of functionality of modules. For example, the modules discussed herein may be decomposed into sub-modules to be executed as multiple computer processes. Moreover, alternative embodiments may combine multiple instances of a particular module or sub-module. Furthermore, those skilled in the art will recognize that the operations described in various embodiments are for illustration only. Operations may be combined or the functionality of the operations may be distributed in additional operations in accordance with the invention.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the various configurations may be implemented as a combined structure or component. These and other variations, modifications, additions, and improvements may fall within the scope of the invention as defined in the claims that follow.

What is claimed is:

1. A method comprising:
   storing power loss recovery information related to an active operation in non-volatile storage in response to detection of a power loss condition,
   wherein the power loss recovery information includes a current random number generated by a security application.

2. The method as recited in claim 1, wherein the power loss recovery information includes information that is updated frequently during normal operation and that must be retained upon the detection of the power loss condition.

3. The method as recited in claim 1, wherein the non-volatile memory includes a flash memory array.

4. The method as recited in claim 1, wherein the non-volatile memory includes a polymer memory array.

5. The method as recited in claim 1, wherein the non-volatile memory includes a phase change memory array.

6. The method as recited in claim 1, further comprising utilizing the power loss recovery information to complete the active operation upon a return of power.

7. The method as recited in claim 6, wherein the power loss recovery information is read directly from the non-volatile memory.

8. The method as recited in claim 6, further comprising copying the power loss recovery information to volatile storage from the non-volatile storage upon power recovery prior to the utilizing the power loss recovery information.

9. The method as recited in claim 1, wherein the active operation is a format information write operation.

10. An apparatus comprising:
volatile storage to store power loss recovery information related to an active operation;
non-volatile storage; and
a controller to copy the power loss recovery information from the volatile storage to the non-volatile storage upon detection of a power loss condition,
wherein the power loss recovery information includes a current random number generated by a security application.

11. The apparatus as recited in claim 10, wherein the power loss recovery information includes information that is updated frequently during normal operation and that must be retained upon the detection of the power loss condition.

12. The apparatus as recited in claim 10, wherein the non-volatile memory includes a flash memory array.

13. The apparatus as recited in claim 10, wherein the non-volatile memory includes a polymer memory array.

14. The apparatus as recited in claim 10, wherein the power loss recovery information is used to complete the active operation upon a return of power.

15. The apparatus as recited in claim 14, wherein the power loss recovery information used to complete the active operation is read directly from the non-volatile memory.

16. The apparatus as recited in claim 10, wherein the active operation is a format information write operation.

17. A system comprising:
a processor; and
a memory device coupled to the processor, the memory device comprising:
volatile storage to store power loss recovery information related to an active operation;
non-volatile storage; and
a controller to copy the power loss recovery information from the volatile storage to the non-volatile storage upon detection of a power loss condition,
wherein the power loss recovery information includes a current random number generated by a security application.

18. The system as recited in claim 17, wherein the non-volatile memory includes a flash memory array.

19. The system as recited in claim 17, wherein the non-volatile memory includes a polymer memory array.

20. The system as recited in claim 17, wherein the power loss recovery information is used to complete the active operation upon a return of power.

21. The system as recited in claim 17, wherein the active operation is a format information write operation.

22. The system as recited in claim 17, further comprising an antenna coupled to the processor.

\* \* \* \* \*